US006916712B2

United States Patent
Kocon et al.

(10) Patent No.: US 6,916,712 B2
(45) Date of Patent: Jul. 12, 2005

(54) MOS-GATED DEVICE HAVING A BURIED GATE AND PROCESS FOR FORMING SAME

(75) Inventors: Christopher B. Kocon, Plains, PA (US); Jun Zeng, Moutaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/039,319

(22) Filed: Nov. 9, 2001

(65) Prior Publication Data

US 2002/0056871 A1 May 16, 2002

Related U.S. Application Data (62) Division of application No. 09/260,411, filed on Mar. 1, 1999, now Pat. No. 6,351,009.

(51) Int. Cl.[7] ............................................. H01L 21/336
(52) U.S. Cl. ........................ 438/270; 438/271; 438/272
(58) Field of Search ................................. 438/270, 271, 438/272

(56) References Cited

U.S. PATENT DOCUMENTS

| | | | |
|---|---|---|---|
| 4,364,073 A | 12/1982 | Becke et al. | |
| 4,969,028 A | 11/1990 | Baliga | |
| 5,034,785 A | 7/1991 | Blanchard | |
| 5,082,795 A | * 1/1992 | Temple | 438/138 |
| 5,298,780 A | * 3/1994 | Harada | 257/330 |
| 5,323,040 A | * 6/1994 | Baliga | 257/332 |
| 5,578,508 A | * 11/1996 | Baba et al. | 438/270 |
| 5,637,898 A | * 6/1997 | Baliga | 257/330 |
| 5,672,889 A | * 9/1997 | Brown | 257/77 |
| 5,689,128 A | * 11/1997 | Hshieh et al. | 257/331 |

(Continued)

FOREIGN PATENT DOCUMENTS

| | | | | |
|---|---|---|---|---|
| EP | 00102398.5 | 9/2000 | | |
| JP | 53-142189 | 12/1978 | | |
| JP | 62193261 A | * 8/1987 | ........... | H01L/21/76 |
| JP | 02144971 | 4/1990 | | |
| JP | 405-82791 | 4/1993 | | |
| JP | 405-275691 | 10/1993 | | |
| JP | 405-347414 | 10/1993 | | |
| JP | 11354780 | 12/1999 | | |

OTHER PUBLICATIONS

Jonathan Evans, et al, "The Behaviour of Very High Current Density Power MOSFETs", *IEEE Electron Devices Society*, pp. 157–160 (May 1996).

(Continued)

*Primary Examiner*—Paul E Brock, II
(74) *Attorney, Agent, or Firm*—Thomas R. Fitzgerald; Larry S. Roach (57) ABSTRACT

An improved trench MOS-gated device comprises a monocrystalline semiconductor substrate on which is disposed a doped upper layer. The upper layer includes at an upper surface a plurality of heavily doped body regions having a first polarity and overlying a drain region. The upper layer further includes at its upper surface a plurality of heavily doped source regions having a second polarity opposite that of the body regions A gate trench extends from the upper surface of the upper layer to the drain region and separates one source region from another. The trench has a floor and sidewalls comprising a layer of dielectric material and contains a conductive gate material filled to a selected level and an isolation layer of dielectric material that overlies the gate material and substantially fills the trench. The upper surface of the overlying layer of dielectric material in the trench is thus substantially coplanar with the upper surface of the upper layer. A process for forming an improved MOS-gate device provides a device whose gate trench is filled to a selected level with a conductive gate material, over which is formed an isolation dielectric layer whose upper surface is substantially coplanar with the upper surface of the upper layer of the device.

11 Claims, 5 Drawing Sheets

U.S. PATENT DOCUMENTS

| | | | |
|---|---|---|---|
| 5,714,781 A | * 2/1998 | Yamamoto et al. | 257/329 |
| 5,828,100 A | 10/1998 | Tamba et al. | |
| 5,864,159 A | 1/1999 | Takahashi | |
| 5,877,520 A | 3/1999 | Hynecek | |
| 5,877,527 A | * 3/1999 | Okabe et al. | 257/390 |
| 5,907,169 A | 5/1999 | Hshieh et al. | |
| 5,929,481 A | 7/1999 | Hshieh et al. | |
| 5,977,588 A | 11/1999 | Patel | |
| 5,986,304 A | 11/1999 | Hshieh et al. | |
| 5,998,268 A | * 12/1999 | Tomatsu et al. | 438/271 |
| 5,998,836 A | 12/1999 | Williams | |
| 5,998,837 A | 12/1999 | Williams | |
| 6,043,531 A | 3/2000 | Stecher et al. | |
| 6,084,264 A | * 7/2000 | Darwish | 257/329 |
| 6,090,716 A | * 7/2000 | Floyd et al. | 438/700 |
| 6,429,481 B1 | * 8/2002 | Mo et al. | 257/341 |

OTHER PUBLICATIONS

Jonathan Evans, et al., "The Behavior of Very High Current Density Power MOSFETs", *IEEE Transactions on Electron Devices*, vol. 44, No. 7, pp. 1148–1153 (Jul. 1997).

Bulucea, Constantin, et al., "Trench DMOS Transistor Technology for High–Current (100 A Range) Switching", *Solid–State Electronics*, vol. 34, vol. 5, Head Hill Hall, Oxford, GB, pp. 493–507 (May 1991).

Matsumoto, Satoshi, et al., "A High Performance Self–Aligned UMOSFET With a Vertical Trench Contact Structure", *IEEE Transactions on Electron Devices*, vol. 41, No. 5, New York, New York, US, pp. 1–5 (May 1994).

International Search Report.

* cited by examiner

MOS-GATED DEVICE HAVING A BURIED GATE AND PROCESS FOR FORMING SAME

CROSS-REFERENCE TO RELATED APPLICATIONS

This application is a divisional application of U.S. patent application Ser. No. 09/260,411, filed Mar. 1, 1999 now U.S. Pat. No. 6,351,009.

FIELD OF THE INVENTION

The present invention relates to semiconductor devices and, more particularly, to an MOS-gated device and a process for forming same.

BACKGROUND OF THE INVENTION

An MOS transistor that includes a trench gate structure offers important advantages over a planar transistor for high current, low voltage switching applications. In the latter configuration, constriction occurs at high current flows, an effect that places substantial constraints on the design of a transistor intended for operation under such conditions.

A trench gate of a DMOS device typically includes a trench extending from the source to the drain and having sidewalls and a floor that are each lined with a layer of thermally grown silicon dioxide. The lined trench is filled with doped polysilicon. The structure of the trench gate allows less constricted current flow and, consequently, provides lower values of specific on-resistance. Furthermore, the trench gate makes possible a decreased cell pitch in an MOS channel extending along the vertical sidewalls of the trench from the bottom of the source across the body of the transistor to the drain below. Channel density is thereby increased, which reduces the contribution of the channel to on-resistance. The structure and performance of trench DMOS transistors are discussed in Bulucea and Rossen, "Trench DMOS Transistor Technology for High-Current (100 A Range) Switching," in *Solid-State Electronics*, 1991, Vol. 34, No. 5, pp 493–507, the disclosure of which is incorporated herein by reference. In addition to their utility in DMOS devices, trench gates are also advantageously employed in insulated gate bipolar transistors (IGBTs), MOS-controlled thyristors (MCTs), and other MOS-gated devices.

Figure 1:
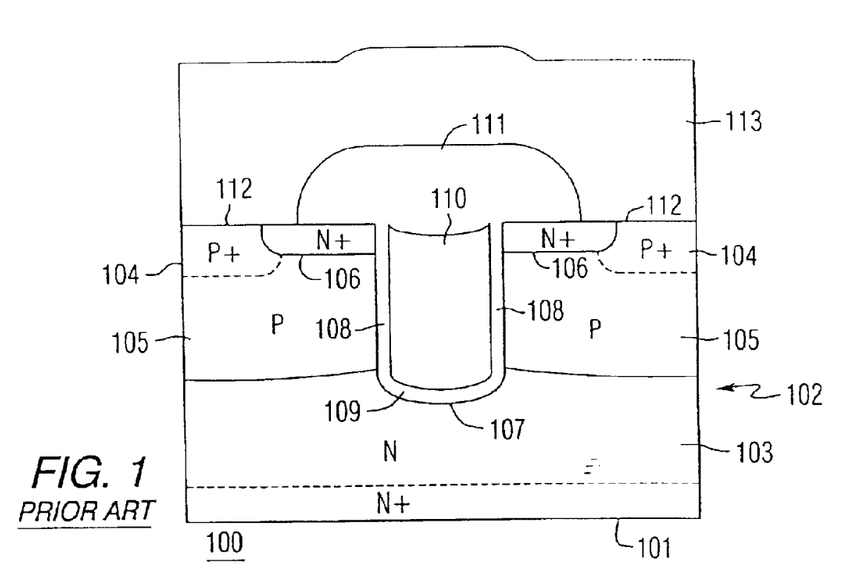
FIG. 1 schematically depicts a cross-section of a trench MOS-gated device 100 of the prior art.

FIG. 1 schematically depicts the cross-section of a trench MOS gate device 100 of the prior art. Although FIG. 1 shows only one MOSFET, a typical device currently employed in the industry consists of an array of MOSFETs arranged in various cellular or stripe layouts.

Device 100 includes a doped (depicted as N+) substrate 101 on which is grown a doped epitaxial layer 102. Epitaxial layer 102 includes drain region 103, heavily doped (P+) body regions 104, and P-wells 105. Abutting body regions in epitaxial layer 103 are heavily doped (N+) source regions 106, which are separated from each other by a gate trench 107 that has dielectric sidewalls 108 and floor 109. Gate trench 107 is substantially filled with gate semiconductor material 110. Because the source regions 106 and gate semiconductor material 110 have to be electrically isolated for device 100 to function, they are covered by a dielectric layer 111. Contact openings 112 enable metal 113 to contact body regions 104 and source regions 106.

Contact openings 112 are formed in dielectric layer 111, which typically is a deposited layer of oxide, by conventional mask/etch techniques. The size of device 100 depends on the minimum thickness of dielectric needed for isolation (the lateral distance between a source region 106 and gate trench 107) and on the tolerance capabilities of the mask/etch procedures. The thickness of dielectric layer 111 is determined not only by the minimum required voltage isolation but also on the need to minimize source-to-gate capacitance, which affects device switching speed and switching losses. Switching losses are directly proportional to the capacitance, which is in turn inversely proportional to the dielectric thickness. Therefore there is a typical minimum thickness of about 0.5–0.8 $\mu$m for dielectric layer 111 in prior art device 100.

As just noted, the required minimum thickness of dielectric layer 111 imposes limitations on the minimum size of device 100. It would be desirable to be able to reduce the size and improve the efficiency of semiconductor devices. The present invention provides these benefits.

SUMMARY OF THE INVENTION

The present invention is directed to an improved trench MOS-gated device formed on a monocrystalline semiconductor substrate comprising a doped upper layer. The doped upper layer, includes at an upper surface a plurality of heavily doped body regions having a first polarity and overlying a well region and a drain region. The upper layer further includes at its upper surface a plurality of heavily doped source regions that have a second polarity opposite that of the body regions and extend to a selected depth in the upper layer.

A gate trench extends from the upper surface of the upper layer through the well region to the drain region and separates one source region from a second source region. The trench has a floor and sidewalls comprising a layer of dielectric material and contains a conductive gate material filling the trench to a selected level and an isolation layer of dielectric material that overlies the gate material and substantially fills the trench. The upper surface of the overlying layer of dielectric material in the trench is thus substantially coplanar with the upper surface of the upper layer.

Also in accordance with the present invention is a process for forming an improved, high density, self-aligned trench MOS-gated device. A doped upper layer having an upper surface and an underlying drain region is formed on a substrate, and a well region having a first polarity is formed in the upper layer over the drain region. A gate trench mask is formed on the upper surface of the upper layer, and a plurality of gate trenches extending from the upper surface through the well region to the drain region are etched in the upper layer.

Sidewalls and a floor each comprising a dielectric material are formed in each of the gate trenches, which are filled to a selected level with a conductive gate material. The trench mask is removed, and an isolation layer of dielectric material is formed on the top surface of the upper layer and within the gate trench, where it overlies the gate material and substantially fills the trench. The dielectric layer is removed from the top surface of the upper layer; the dielectric layer remaining within the trench has an upper surface that is substantially coplanar with the upper surface of the upper layer.

A plurality of heavily doped body regions having a first polarity are formed at the upper surface of the upper layer. A source mask is formed on the upper surface, and a plurality of heavily doped source regions having a second polarity and extending to a selected depth into the upper layer are formed in the body regions. Following removal of the source mask, a metal contact to said body and source regions is formed over the upper surface of the upper layer.

DETAILED DESCRIPTION OF THE INVENTION

The trench MOS-gated device of the present invention, by eliminating the surface area required for gate-source dielectric isolation, enables the size of the device to be substantially reduced. A masking procedure to form contact openings in the dielectric layer is also avoided; the gate trench of the invention is thus self-aligned.

Figure 2:
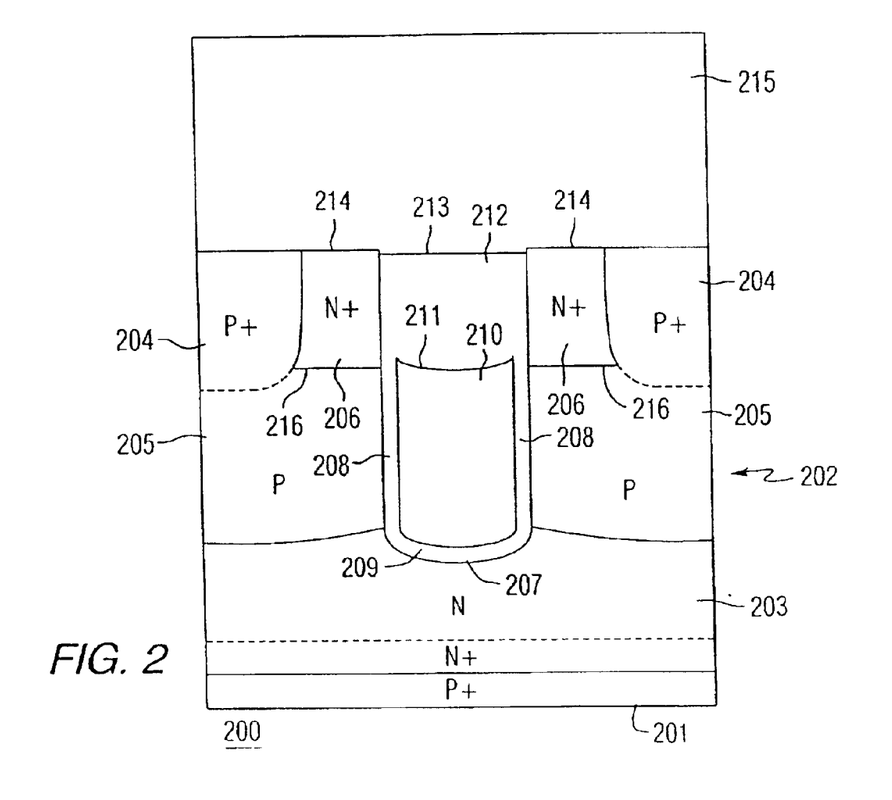
FIG. 2 is a schematic cross-sectional representation of a trench MOS-gated device 200 of the present invention.

FIG. 2 depicts an improved trench MOS-gated device 200 of the present invention. Device 200 includes a doped N+ substrate 201 on which is deposited an epitaxial doped upper layer 202. Epitaxial layer 202 includes drain region 203, heavily doped P+ body regions 204, and P-well regions 205. Abutting body regions 204 in epitaxial layer 203 are heavily doped N+ source regions 206, which are separated from each other by a gate trench 207 that has dielectric sidewalls 208 and floor 209. Contained within trench 207 is a gate material 210, filled to a selected level 211, and an overlying dielectric layer 212. Selected level 211 of gate material 210 is approximately coplanar with the selected depth 216 of N+ source regions 206, thereby providing overlap between source regions 206 and gate material 210. The surface 213 of gate dielectric layer 212 is substantially coplanar with the surface 214 of epitaxial layer 202. Deposited metal layer 215 is able to contact body regions 204 and source regions 206 without the need for a masking procedure to form contact openings, as was required for prior art device 100.

Because gate material 210 is recessed within gate trench 207 to permit the inclusion of dielectric layer 212 of sufficient thickness to provide gate isolation, diffusions to form N+ source regions 206 must be deep enough to ensure overlap with gate material 210. Although source regions 206 are shown as having N polarity and body regions 204 are depicted as having P polarity in device 200, it is understood that the polarities of these regions can be reversed from those shown in FIG. 2.

Figure 2A:
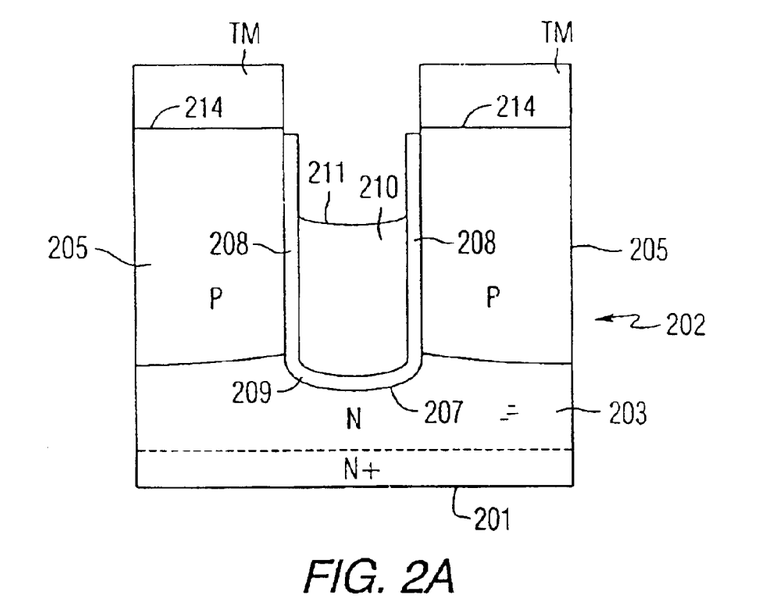
FIGS. 2A–D illustrate the process of forming device 200.

FIGS. 2A–D schematically illustrate the process of forming device 200. As shown in FIG. 2A, on a doped semiconductor substrate 201, which can be monocrystalline silicon, is formed a doped upper layer 202 that includes a drain region 203. Upper layer 202 can be epitaxially grown silicon or, for lower voltage devices (ca 12V), a heavily doped portion of substrate 201. P well regions 205 are formed in layer 202 by doping into upper layer surface 214. A trench mask TM patterned to define a gate trench is formed on surface 214, and gate trench 207 extending through P-well regions 205 to drain region 203 is etched in layer 202. Trench dielectric sidewalls 208 and floor 209, preferably comprising silicon dioxide, which can be either deposited or grown, are formed in gate trench 207, which is then filled with a conductive gate material 210, which can be, for example, a metal, a silicide, or doped polysilicon, to a selected depth 211.

Figure 2B:
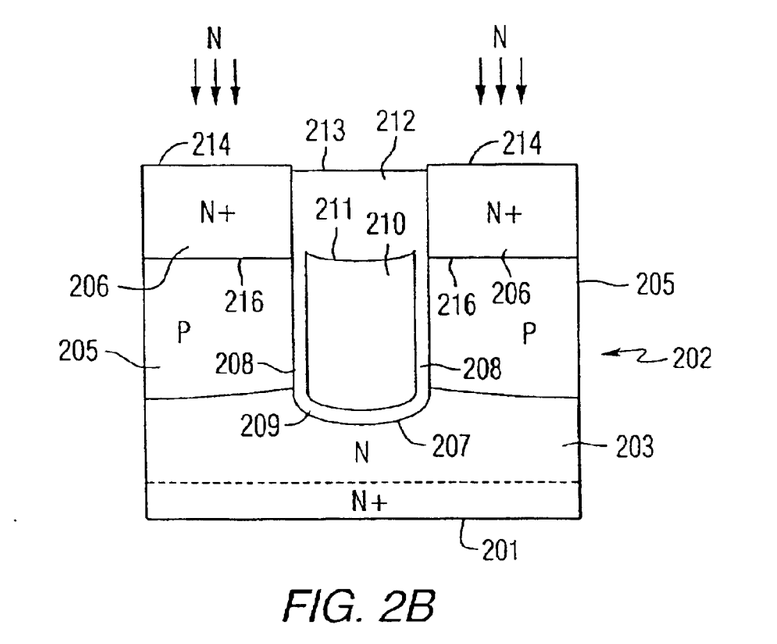

Referring to FIG. 2B, following removal of trench mask TM, filling of trench 207 is completed by forming an isolation dielectric layer 212, which can be silicon dioxide, over gate material 210 in trench 20 and on surface 214. A planarization dielectric etch is performed to re-expose surface 214 without removing dielectric material 212 from trench 207. Surface 213 of dielectric layer 212 in trench 207 is thereby rendered substantially coplanar with upper surface 214 of layer 202. It may be advantageous, however, to etch surface 213 slightly below surface 214 in order to increase source contact and improve device on-resistance characteristics.

Also as shown in FIG. 2B, N+ source regions 206 are formed in layer 202 by ion implantation and diffusion to a selected depth 216 that is approximately coplanar with selected level 211 of gate material 210 and thereby provides overlap between gate material 210 and source regions 206.

Figure 2C:
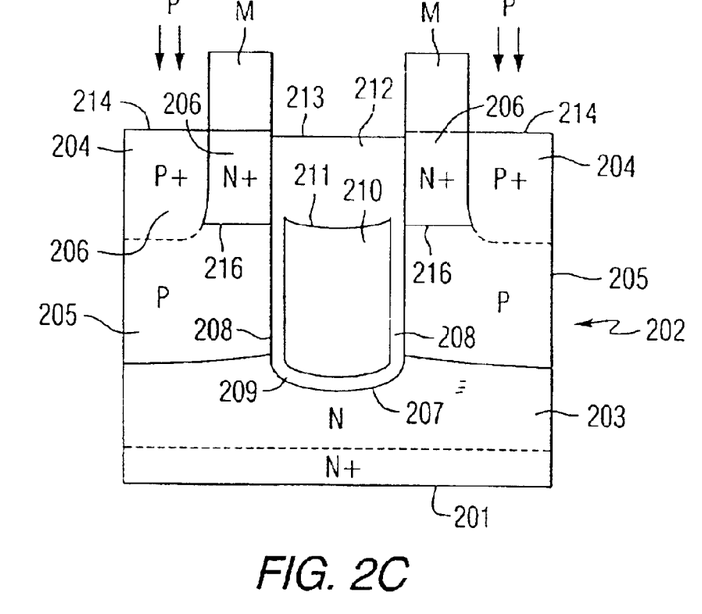
Figure 2D:
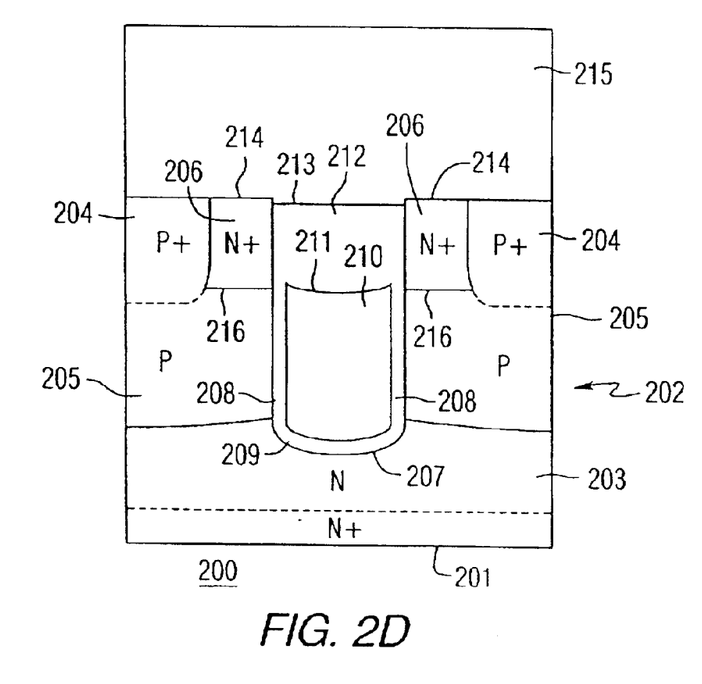

Referring to FIG. 2C, a body mask M is formed on surface 214, and P+ body regions 204 are formed by further doping of layer 202. Removal of the body mask M, followed by deposition of metal 215 to provide contact with body regions 204 and source regions 206, completes the formation of device 200, as shown in FIG. 2D. Metal (not shown) can be deposited on the reverse side of the substrate to provide contact with drain region 203. Although in the just described fabrication sequence, the formation of source regions 206 preceded the formation of body regions 204, it is recognized that this ordering is not critical and that the described masking procedure can be varied for the purpose of convenience.

Gate trenches 207 included in a device of the present invention may have an open-cell stripe topology or a closed-cell cellular topology. Furthermore, in the closed-cell cellular topology, the trenches may have a square or, more preferably, a hexagonal configuration. Although device 200, as schematically depicted in FIG. 2, is a power MOSFET, the present invention is applicable to the construction of other MOS-gated devices such as an insulated gate bipolar transistor (IGBT), an MOS-controlled thyristor (MCT), and an accumulation field effect transistor (ACCUFET).

Figure 3A:
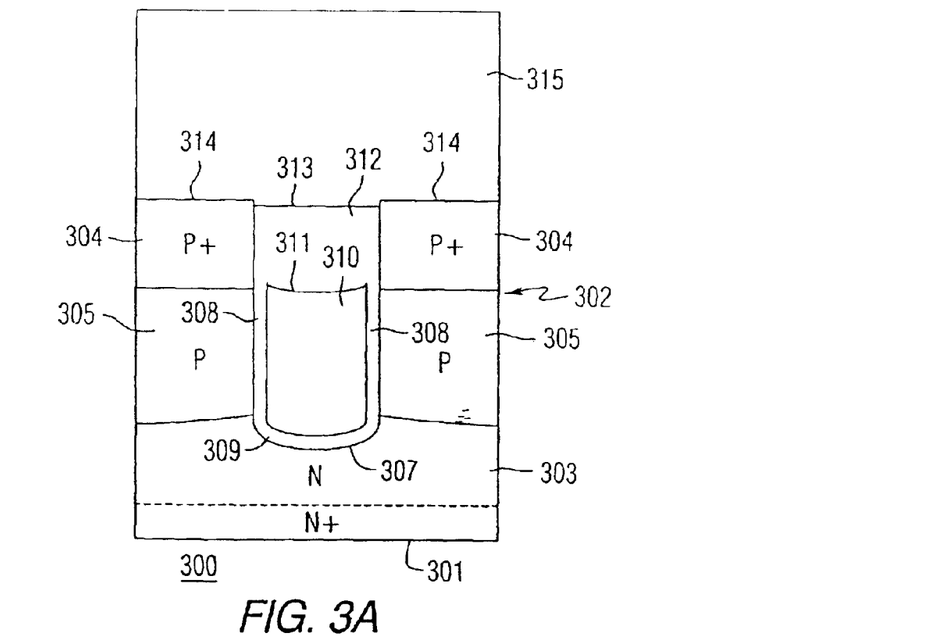
FIGS. 3A and 3B schematically depict cross-sections of another device 300 in accordance with the present invention.
Figure 3B:
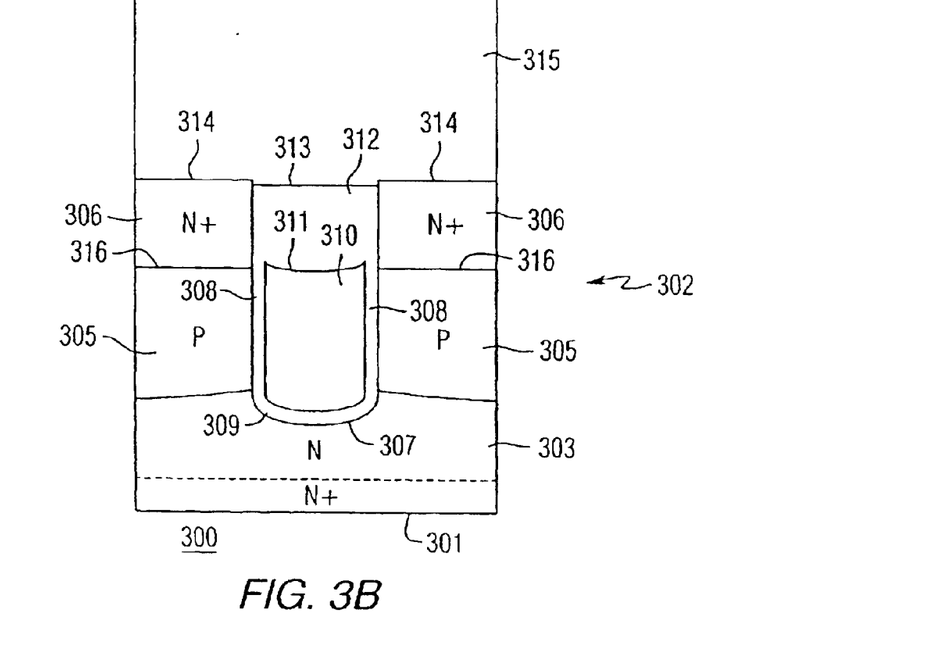
Figure 3C:
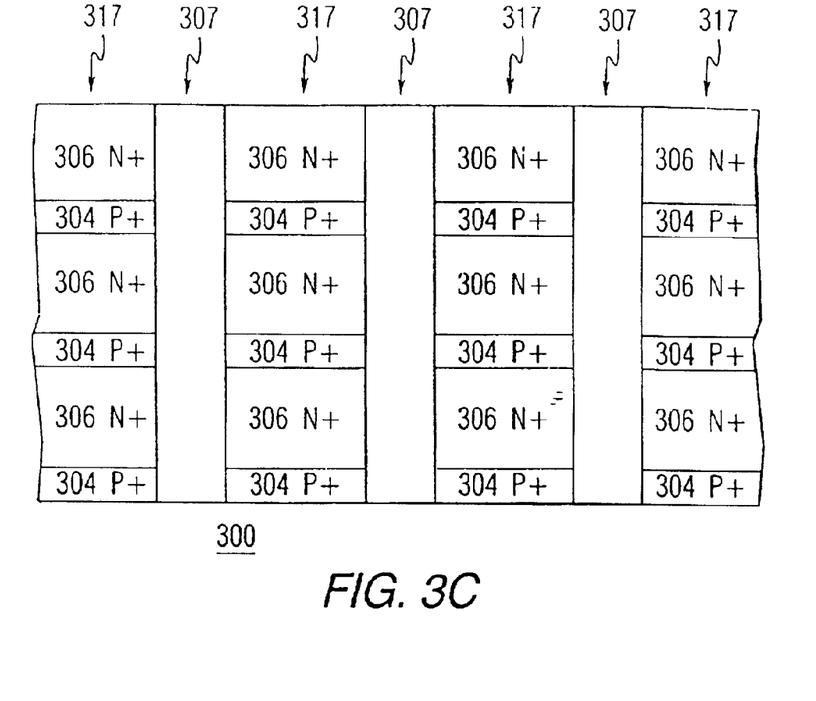
FIG. 3C is a schematic plan view of device 300.
Figure 4:
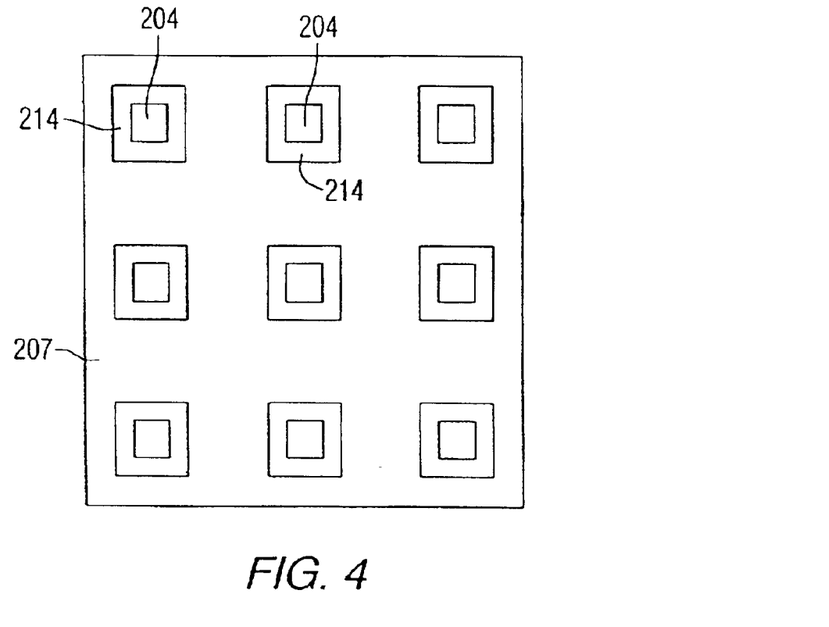
FIG. 4 is a top-view of one embodiment of a trench MOS-gated device of the present invention having a plurality of gate trenches and a closed-cell cellular topology.

FIGS. 3A–C depict an alternative embodiment of the present invention. Device 300 includes a doped N+ substrate 301, on which is disposed a doped upper layer 302. Upper layer 302 includes drain region 303 and P-wells 305. As shown in FIG. 3A, P+ body regions 304 are formed in layer 302 and separated from each other by a gate trench 307. Similarly, as depicted in FIG. 3B, N+ source regions 306, formed by ion implantation and diffusion to a selected depth 316 in upper layer 302, are also separated by gate trench 307. Gate trenches 307 each have dielectric sidewalls 308 and a floor 309 and contain conductive gate material 310, filled to a selected level 311, and an overlying dielectric layer 312. The surface 313 of gate dielectric layer 312 is substantially coplanar with the surface 314 of upper layer 302. Metal layer 315 is deposited on surface 314 to contact body regions 304 and source regions 306.

As shown in FIG. 3C, device 300 includes a plurality of arrays 317 of alternating P+ body regions 304 and N+ source regions 306. Each array 317 is disposed adjacent to a gate trench 307 and separated from a second array 317 by the gate trench 307. Also, as depicted in FIG. 3C, source regions 306 comprise a greater portion, body regions 304 a lesser portion, of the lengthwise dimension of an array 317 disposed alongside a gate trench 307.

In the formation of device 300, following the planarization of dielectric layer 312 to re-expose surface 314, P+ body regions are formed in upper layer 302 by doping. A non-critical source mask (not shown), disposed transversely to trenches 307, is formed on surface 314, and source regions 306 are formed by ion implantation and diffusion. The arrangement of body regions 304 and source regions 306 in arrays 317 separated by gate trenches 307, as depicted for device 300 in FIGS. 3A–C, further exploits the advantage of device size reduction provided by present invention.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. A process for forming an improved trench MOS-gated device, said process comprising:
   (a) forming a doped upper layer on a semiconductor substrate, said upper layer having an upper surface and an underlying drain region;
   (b) forming a well region having a first polarity in said upper layer, said well region overlying said drain region;
   (c) forming a gate trench mask on said upper surface of said upper layer;
   (d) forming a plurality of gate trenches extending from the upper surface of said upper layer through said well region to said drain region, said gate trenches having sidewalls and floors;
   (e) covering said sidewalls and floors with a layer of dielectric material;
   (f) forming gate electrodes in the trenches to a selected level substantially below the upper surface of said upper level with a conductive gate material,
   (g) removing said trench mask from the upper surface of said upper layer;
   (h) forming an isolation layer of dielectric material on the upper surface of said upper layer and over said dielectric material covering said sidewalls within said gate trench, said isolation layer overlying said gate material and substantially filling said trench;
   (i) removing said isolation layer from the upper surface of said upper layer, a portion of said isolation layer remaining within and substantially filling said trench, and having an upper surface that is proximate to and slightly below the upper surface of said upper layer to increase source contact areas and reduce on resistance;
   (j) implanting the entire upper surface of the substrate and diffusing into the surface of the substrate source dopants having a second polarity to form a plurality of heavily doped source regions that extend into the substrate along the sides of the trenches;
   (k) implanting and diffusing into the surface a plurality of heavily doped body regions having a first polarity, said body regions overlying the drain region in said upper layer; and
   (l) forming a metal contact to said body and source regions over the upper surface of said upper layer.

2. The process of claim 1 wherein the depth of the level of the diffused implants for the source regions is substantially coplanar with the level of the conductive gate material in the trenches.

3. A process for forming an improved trench MOS-gated device, said process comprising:
   (a) forming a doped upper layer on a semiconductor substrate, said upper layer having an upper surface and an underlying drain region;
   (b) forming a well region having a first polarity in said upper layer, said well region overlying said drain region;
   (c) forming a gate trench mask on said upper surface of said upper layer;
   (d) forming a plurality of gate trenches extending from the upper surface of said upper layer through said well region to said drain region, said gate trenches having sidewalls and floors;
   (e) covering said sidewalls and floors with a layer of dielectric material;
   (f) forming gate electrodes in the trenches to a selected level substantially below the upper surface of said upper level with a conductive gate material,
   (g) removing said trench mask from the upper surface of said upper layer without removing the layer of dielectric material covering said sidewalls of said trenches;
   (h) forming an isolation layer of dielectric material on the upper surface of said upper layer and over said dielectric material covering said sidewalls within said gate trench, said isolation layer overlying said gate material and substantially filling said trench;
   (i) removing said isolation layer from the upper surface of said upper layer, a portion of said isolation layer remaining within and substantially filling said trench, and having an upper surface that is proximate to and slightly below the upper surface of said upper layer to increase source contact areas and reduce on resistance;
   (j) forming a plurality of heavily doped source regions having a second polarity in said well region, said source regions extending to a selected depth from the upper surface of said upper layer where said selected depth is substantially coplanar with the level of the conductive gate material in the trench, said step of forming the plurality of heavily doped source regions comprising implanting the entire upper surface of said substrate with ions of said second polarity, then forming a body mask on the upper surface of said substrate;
   (k) forming a plurality of heavily doped body regions having a first polarity at the upper surface of said upper layer, said body regions overlying the drain region in said upper layer, said step of forming a plurality of heavily doped body regions comprising doping the upper surface of said substrate with a dopant of said first polarity, then removing said body mask; and
   (l) forming a metal contact to said body and source regions over the upper surface of said upper layer.

4. The process of claim 3 wherein said substrate comprises monocrystalline silicon.

5. The process of claim 3 wherein said upper layer comprises an epitaxial layer.

6. The process of claim 3 wherein one of said source regions surround said body regions and the source regions are separated from each other by trenches.

7. The process of claim 3 wherein said dielectric material covering said sidewalls and said floor, and forming said isolation layer in said gate trench comprises silicon dioxide.

8. The process of claim 3 wherein said conductive gate material within said gate trench is selected from the group consisting of a metal, a silicide, and doped polysilicon.

9. The process of claim 3 wherein said first polarization polarity is P and said second polarity is N.

10. The process of claim 3 wherein said device is selected from the group consisting of a power MOSFET, an insulated gate bipolar transistor, an MOS-controlled thyristor, and an accumulation FET.

11. A process for forming an improved trench MOS-gated device, said process comprising:
  (a) forming a doped upper layer on a semiconductor substrate, said upper layer having an upper surface and an underlying drain region;
  (b) forming a well region having a first polarity in said upper layer, said well region overlying said drain region;
  (c) forming a gate trench mask on said upper surface of said upper layer;
  (d) forming a gate trench extending from the upper surface of said upper layer through said well region to said drain region, said gate trench having sidewalls and a floor;
  (e) covering said sidewalls and floor with a layer of gate dielectric material;
  (f) forming gate electrodes in the trenches to a selected level with a conductive gate material, said selected level being substantially below the upper surface of said upper level, a portion of said gate dielectric material covering said sidewalls from said selected level to proximate said upper surface of said upper layer;
  (g) removing said trench mask from the upper surface of said upper layer without removing said portion of said gate dielectric material covering said sidewalls from said selected level to proximate said upper surface of said upper layer;
  (h) forming an isolation layer of dielectric material on the upper surface of said upper layer and over said dielectric material covering said sidewalls within said gate trench, said isolation layer overlying said gate material and substantially filling said trench;
  (i) removing said isolation layer from the upper surface of said upper layer, a portion of said isolation layer remaining within and substantially filling said trench, and having an upper surface that is proximate to and slightly below the upper surface of said upper layer to increase source contact areas and reduce on resistance,
  (j) forming a plurality of heavily doped source regions having a second polarity in said well region, said source regions extending to a selected depth from the upper surface of said upper layer where said selected depth is substantially coplanar with the level of the conductive gate material in the trench, said step of forming a plurality of heavily doped source regions comprising implanting the entire upper surface of said substrate with ions of said second polarity, then forming a body mask on the upper surface of said substrate;
  (k) forming a plurality of heavily doped body regions having a first polarity at the upper surface of said upper layer, said body regions overlying the drain region in said upper layer, said step of forming a plurality of heavily doped body regions comprising doping the upper surface of said substrate with a dopant of said first polarity, then removing said body mask; and
  (l) forming a metal contact to said body and source regions over the upper surface of said upper layer.

* * * * *